US012047483B1

(12) United States Patent
Vercesi et al.

(10) Patent No.: US 12,047,483 B1
(45) Date of Patent: Jul. 23, 2024

(54) DUAL LOOP FOR CLOCK RECOVERY IN CDR

(71) Applicant: Marvell Asia Pte Ltd, Singapore (SG)

(72) Inventors: Luca Vercesi, Pavia (IT); Fernando De Bernardinis, Pavia (IT)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 18/145,190

(22) Filed: Dec. 22, 2022

Related U.S. Application Data

(60) Provisional application No. 63/299,368, filed on Jan. 13, 2022.

(51) Int. Cl.
*H04L 7/033* (2006.01)
*H04L 7/00* (2006.01)

(52) U.S. Cl.
CPC .......... *H04L 7/0331* (2013.01); *H04L 7/0016* (2013.01)

(58) Field of Classification Search
CPC .............................. H04L 7/0331; H04L 7/0016
See application file for complete search history.

(56) References Cited

U.S. PATENT DOCUMENTS

| 9,215,107 B1* | 12/2015 | De Bernardinis | .... H04L 7/0062 |
| 2017/0093558 A1* | 3/2017 | Ramezani | ............ H04L 7/0029 |

* cited by examiner

*Primary Examiner* — Sung S Ahn

(57) ABSTRACT

A method for recovering a clock from input data, in a deserializer that couples a transmission medium to receive circuitry of a data transceiver, includes operating, in a first clock recovery loop, on equalized input data from a data recovery loop to provide a first timing error signal, operating, in a second clock recovery loop, on unequalized input data to provide a second timing error signal, combining the first and second timing error signals, and deriving a recovered clock signal from the combined first and second timing error signals using an oscillator circuit. Combining the first and second timing error signals may include operating on the first and second timing error signals in a manner that filters the first timing error signal to remove low-frequency components including adaptation errors introduced by the data recovery loop, and that filters the second timing error signal to remove high frequency components including jitter.

22 Claims, 7 Drawing Sheets

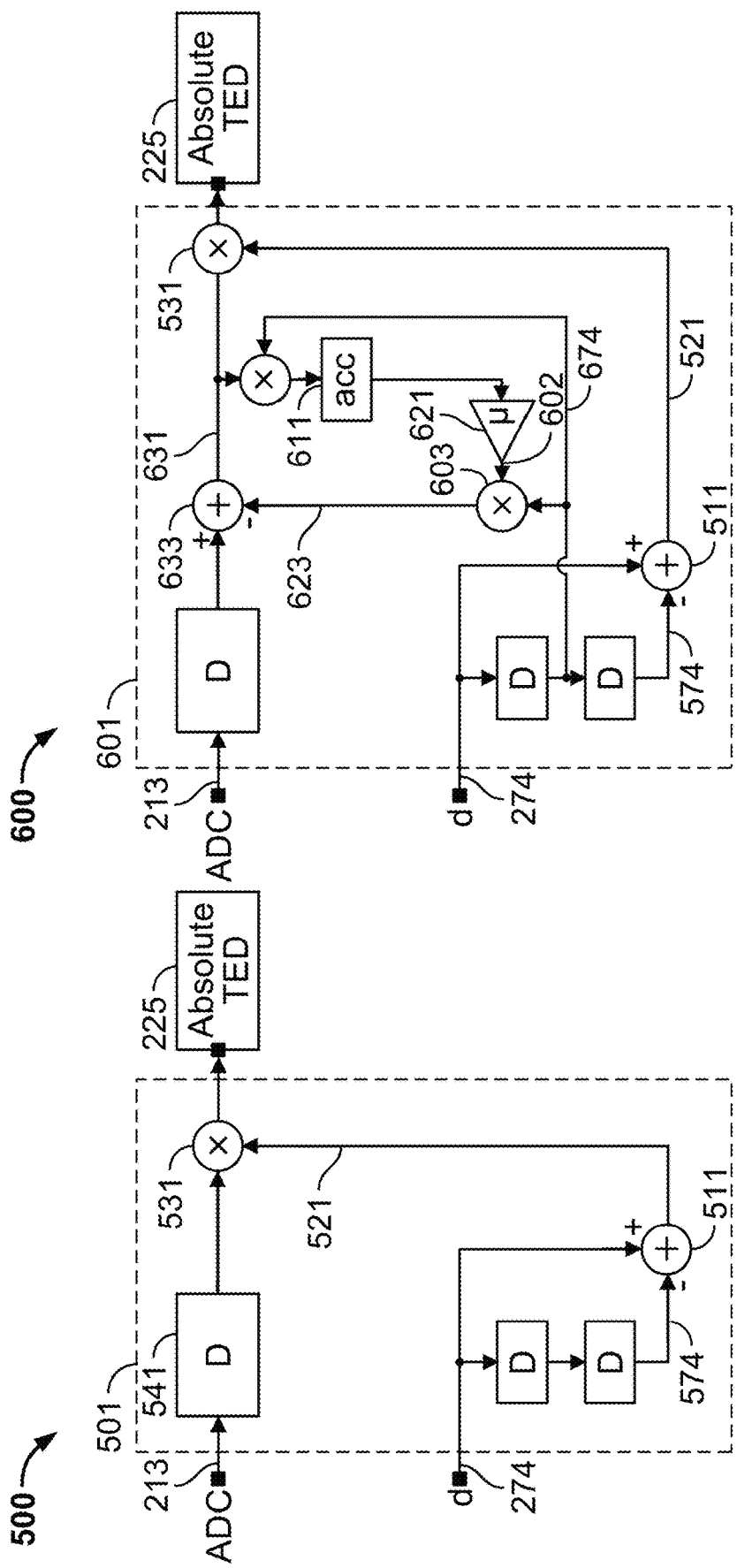

DUAL LOOP FOR CLOCK RECOVERY IN CDR

CROSS REFERENCE TO RELATED APPLICATION

This disclosure claims the benefit of commonly-assigned U.S. Provisional Patent Application No. 63/299,368, filed Jan. 13, 2022, which is hereby incorporated by reference herein in its entirety.

FIELD OF USE

This disclosure relates to clock-data recovery in a serial interface. More particularly, this disclosure relates to the use of a dual clock recovery loop in clock data recovery circuitry.

BACKGROUND

The background description provided herein is for the purpose of generally presenting the context of the disclosure. Work of the inventor hereof, to the extent the work is described in this background section, as well as aspects of the description that may not otherwise qualify as prior art at the time of filing, are neither expressly nor impliedly admitted to be prior art against the subject matter of the present disclosure.

In some types of clock data recovery circuitry, the clock and the data are recovered in separate equalizer paths or loops. For example, the data may be recovered by a feed-forward equalizer which feeds a decision feedback equalizer whose output is used to adaptively adjust the coefficients of the feed-forward equalizer. At the same time, the clock may be recovered in a separate loop, with slicer error from the data loop feeding a timing error detector. However, in such an arrangement, adaptation of the feed-forward equalizer in the data recovery loop may cause errors in the clock recovery loop.

SUMMARY

In accordance with implementations of the subject matter of this disclosure, a data transceiver includes transmit circuitry, receive circuitry, a host interface configured to couple the transmit circuitry and the receive circuitry to a host device, and a line interface configured to couple the transmit circuitry and the receive circuitry to a transmission medium. The line interface includes a serializer configured to couple the transmit circuitry to the transmission medium and a deserializer configured to couple the transmission medium to the receive circuitry. The deserializer includes clock recovery circuitry configured to recover a clock from input data. The clock recovery circuitry includes a first clock recovery loop configured to operate on equalized input data from a data recovery loop to provide a first timing error signal, a second clock recovery loop configured to operate on unequalized input data to provide a second timing error signal, combining circuitry configured to combine the first and second timing error signals, and an oscillator circuit configured to derive a recovered clock signal from the combined first and second timing error signals.

In a first implementation of such a data transceiver, the oscillator circuit may include a phase-locked loop configured to operate on the combined first and second timing error signals to derive the recovered clock signal.

In a second implementation of such a data transceiver, the combining circuitry may include an integrator circuit configured to operate on the second timing error signal prior to adding the second timing error signal to the first timing error signal.

According to a first aspect of that second implementation, the combining circuitry may further include circuitry for adjusting sampling time of the integrator.

In a third implementation of such a data transceiver, the first clock recovery loop may include a first timing error detector configured to provide the first timing error signal, the second clock recovery loop may include a second timing error detector configured to provide the second timing error signal, and the combining circuitry may be configured to operate in a manner that filters the first timing error signal to remove low-frequency components including adaptation errors introduced by the data recovery loop, and that filters the second timing error signal to remove high frequency components including jitter.

According to a first aspect of that third implementation, the second clock recovery loop may include circuitry for removing inter-symbol interference from the unequalized input data prior to providing the second timing error signal.

In a first instance of that first aspect, the circuitry for removing inter-symbol interference may be configured to operate on recovered data from the data recovery loop.

In a first alternative of that first instance, the circuitry for removing inter-symbol interference may include circuitry configured to subtract delayed recovered data from the recovered data, and circuitry configured to combine the recovered data, from which the delayed recovered data has been subtracted, with the unequalized input data prior to providing the second timing error signal.

In a first variant of that first alternative, the circuitry for removing inter-symbol interference may further include circuitry configured to accumulate delayed recovered data, circuitry configured to combine the accumulated delayed recovered data with current delayed recovered data, and circuitry configured to subtract the combined accumulated delayed recovered data and current delayed recovered data from the unequalized input data prior to combining the unequalized input data with the recovered data, from which the delayed recovered data has been subtracted.

In a second variant of that first alternative, the circuitry for removing inter-symbol interference may further include circuitry configured to filter the recovered data, and circuitry configured to subtract the filtered recovered data from the unequalized input data prior to combining the unequalized input data with the recovered data, from which the delayed recovered data has been subtracted.

According to that second variant, the circuitry configured to filter the recovered data may include channel estimator circuitry configured to derive a channel estimate from the recovered data and the unequalized input data, and to derive filter coefficients from the channel estimate, and finite impulse response filter circuitry to filter the recovered data based on the filter coefficients.

In accordance with implementations of the subject matter of this disclosure, a method for recovering a clock from input data, in a deserializer that couples a transmission medium to receive circuitry of a data transceiver, includes operating, in a first clock recovery loop, on equalized input data from a data recovery loop to provide a first timing error signal, operating, in a second clock recovery loop, on unequalized input data to provide a second timing error signal, combining the first and second timing error signals, and deriving a recovered clock signal from the combined first and second timing error signals using an oscillator circuit.

In a first implementation of such a method, deriving the recovered clock signal from the combined filtered first and second timing error signals using the oscillator circuit may include deriving the recovered clock signal from the combined filtered first and second timing error signals using a phase-locked loop configured to operate on the combined first and second timing error signals.

In a second implementation of such a method, combining the filtered first and second timing error signals may include integrating the second timing error signal prior to adding the second timing error signal to the first timing error signal.

According to a first aspect of that second implementation, combining the filtered first and second timing error signals may further include adjusting sampling time of the integration.

In a third implementation of such a method, combining the first and second timing error signals may include operating on the first and second timing error signals in a manner that filters the first timing error signal to remove low-frequency components including adaptation errors introduced by the data recovery loop, and that filters the second timing error signal to remove high frequency components including jitter.

A first aspect of that third implementation may further include removing, in the second clock recovery loop, inter-symbol interference from the unequalized input data prior to providing the second timing error signal.

In a first instance of that first aspect, removing the inter-symbol interference may include operating on recovered data from the data recovery loop.

In a first alternative of that first instance, removing the inter-symbol interference may include subtracting delayed recovered data from the recovered data, and combining the recovered data, from which the delayed recovered data has been subtracted, with the unequalized input data prior to providing the second timing error signal.

In a first variant of that first alternative, removing the inter-symbol interference may further include accumulating delayed recovered data, combining the accumulated delayed recovered data with current delayed recovered data, and subtracting the combined accumulated delayed recovered data and current delayed recovered data from the unequalized input data prior to combining the unequalized input data with the recovered data, from which the delayed recovered data has been subtracted.

In a second variant of that first alternative, removing the inter-symbol interference may further include filtering the recovered data, and subtracting the filtered recovered data from the unequalized input data prior to combining the unequalized input data with the recovered data, from which the delayed recovered data has been subtracted.

According to that second variant, filtering the recovered data may include deriving a channel estimate from the recovered data and the unequalized input data, and deriving filter coefficients from the channel estimate, and applying the filter coefficients to finite impulse response filter circuitry to filter the recovered data.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which:

FIG. 5 is a schematic diagram of a first implementation of a modified timing error detector in accordance with the subject matter of this disclosure;

FIG. 6 is a schematic diagram of a second implementation of a modified timing error detector in accordance with the subject matter of this disclosure;

DETAILED DESCRIPTION

Figure 1:
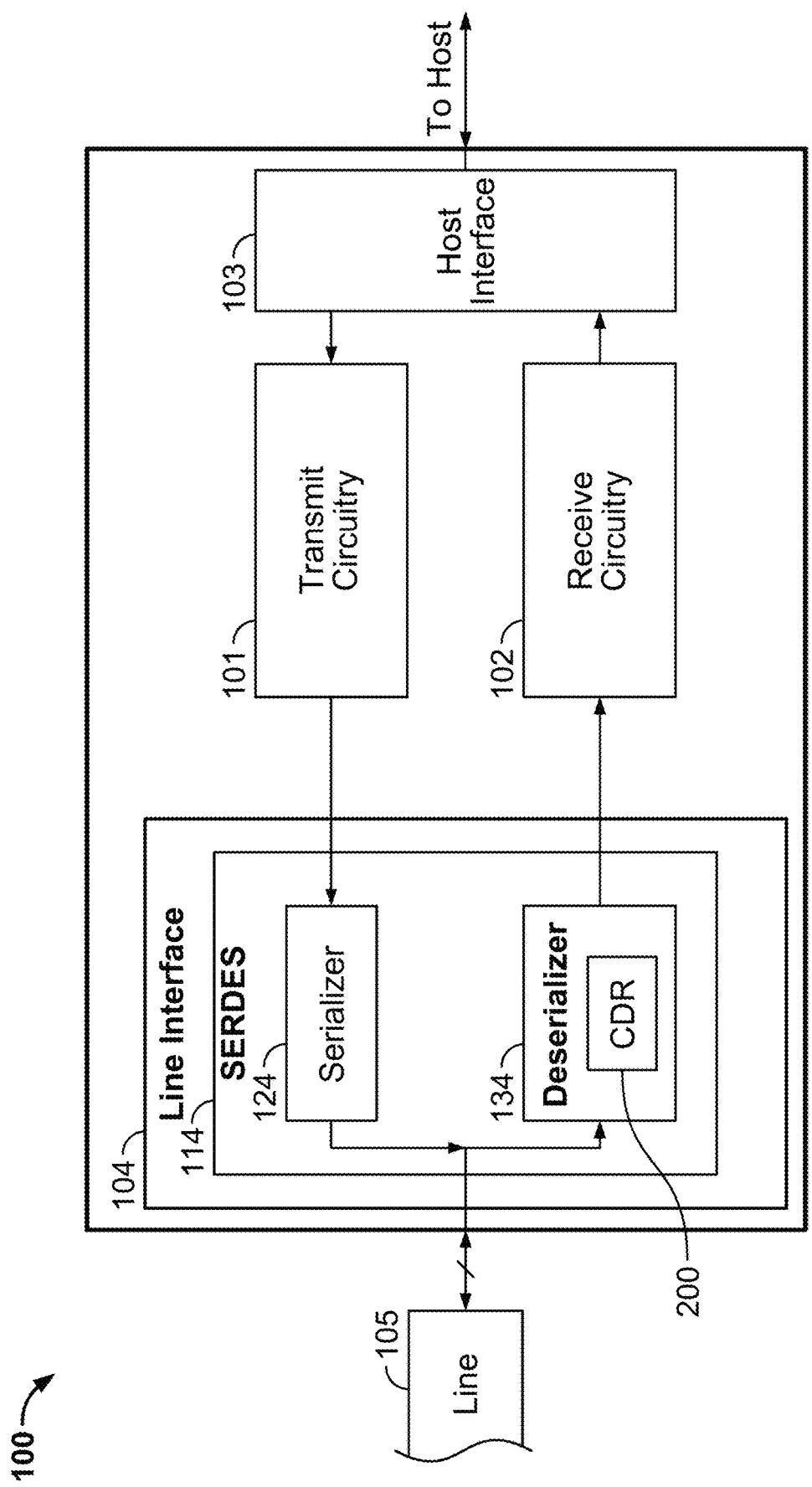
FIG. 1 is a high-level block diagram of a serial data transceiver according to implementations of the subject matter of this disclosure.

As described above, in some types of clock data recovery circuitry, the clock and the data are recovered in separate paths or loops. For example, the data may be recovered by a feed-forward equalizer which feeds a decision feedback equalizer whose output is used to adaptively adjust the coefficients of the feed-forward equalizer. At the same time, the clock may be recovered in a separate loop ("clock recovery loop" or "delay timing loop") in which slicer error from the data recovery loop feeds a timing error detector. However, in such an arrangement, adaptation of the feed-forward equalizer in the delay timing loop, based on output of the decision feedback equalizer, may cause errors in the recovered clock. In some alternatives, adaptation of the feed-forward equalizer is constrained (e.g., some precursors or postcursors are not adapted) to attempt to reduce clock recovery errors, but such constraints may limit performance of the data recovery loop.

In accordance with implementations of the subject matter of this disclosure, clock recovery is improved by using two parallel clock recovery loops. In a first clock recovery loop, a timing error detector operates on the equalized data that is output by the feed-forward equalizer in the data recovery loop, while in the second clock recovery loop, the timing error detector operates directly on unequalized input data. The timing error detector in the second clock recovery loop may have poor jitter characteristics, particularly at higher frequencies, while the timing error detector in the first clock recovery loop may generate errors because of the feed-forward equalizer adaptation, but only at lower frequencies. Therefore, the two loops may be combined in a way that has the effect of filtering the timing error detector in the second clock recovery loop to remove high-frequency noise and thereby eliminate jitter that arises in the higher-frequency components, and that also has the effect of filtering the timing error detector in the first clock recovery loop to remove low-frequency noise and thereby eliminate the adaptation errors that arise in the lower-frequency components. While in some implementations, the foregoing low-pass or high-pass filtering may be performed by low-pass filter circuitry or high-pass filter circuitry, in other implementations, the filtering may be performed by the inherent nature of operation of the loop circuitry, such as by integration. Sampling time for the integration may be adjusted to maximize performance of the clock recovery (e.g., maximize signal-to-noise ratio).

The timing error detector in the second clock recovery loop may be modified in some implementations to filter some sources of jitter, further improving performance. For example, certain cursors of the unfiltered impulse response may be estimated and suppressed or subtracted from the impulse response. Alternatively, a channel estimation may be used to generate coefficients for a finite impulse response filter to remove inter-symbol interference from the unequalized input data.

The timing error detectors used in implementations of the subject matter disclosure may be known forms of timing error detectors such as a zero-forcing timing error detector, or a Mueller-Miller timing error detector.

The subject matter of this disclosure may be better understood by reference to FIGS. 1-8.

FIG. 1 is a high-level block diagram of a serial data transceiver 100 which may incorporate implementations of the subject matter of this disclosure. Transceiver 100 may include transmit circuitry 101 and receive circuitry 102 coupled, at one end to a host interface 103 for communication with a locally-situated host device (not shown), and at the other end to a line interface 104 for sending and receiving signals from and to a transmission medium 105 (e.g., a copper or fiber cable). Data may be communicated serially on transmission medium 105, and line interface 104 may include serializer/deserializer (SERDES) circuitry 114 configured to convert between serial signals on transmission medium 105 and parallel signals at host interface 103. SERDES circuitry 114 include serializer circuitry 124 configured to serialize parallel signals for transmission onto medium 105, and deserializer circuitry 134 configured to deserialize signals received from medium 105.

Figure 2:
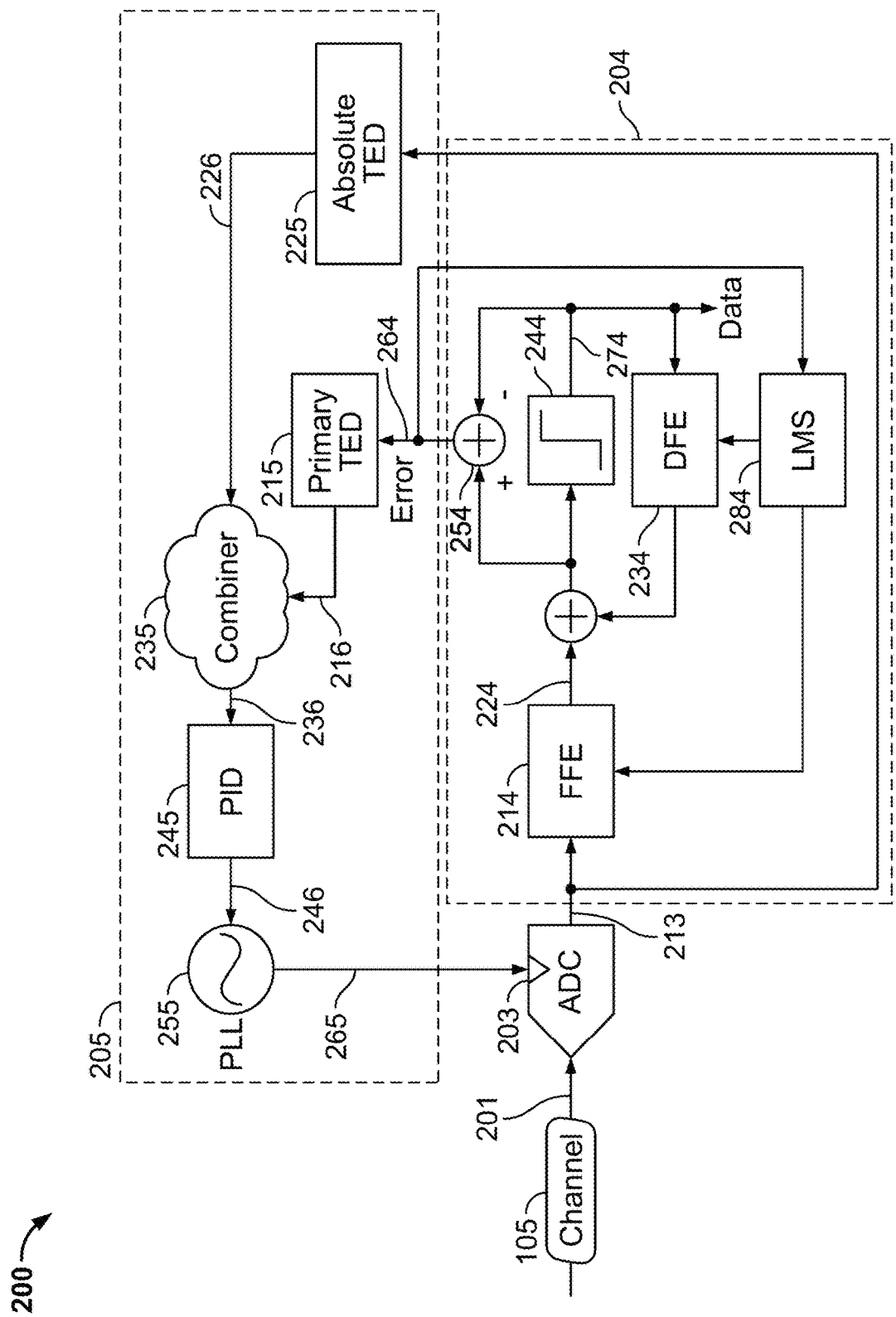
FIG. 2 is a schematic diagram of clock-data recovery circuitry in accordance with a first implementation of the subject matter of this disclosure.

An implementation of clock-data recovery (CDR) circuitry 200 in accordance with the subject matter of this disclosure, which may be incorporated into deserializer circuitry 134, is shown in FIG. 2. Signals 201 received from medium 105 are first filtered (e.g., by a continuous time linear equalizer (not shown)) to remove low-frequency components, and the filtered signals are digitized by analog-to-digital converter (ADC) 203. Digitized signals 213 are input to both data recovery loop 204 and clock recovery loop 205.

Data recovery loop 204 includes FFE 214, which outputs equalized signal 224. Signal 224 is further processed in DFE 234 and slicer circuitry 244. A data error signal 264 is derived at 254 from signal 224 and recovered data 274 (i.e., the input and output of slicer 244) and used to adapt FFE 214 using, for example, a least-mean-squares adaptation function 284.

In accordance with implementations of the subject matter of this disclosure, clock recovery loop 205 includes two separate timing error detectors (TEDs). A first "primary" timing error detector 215 operates on data error signal 264 from data recovery loop 204. A second "absolute", timing error detector 225 operates on the unequalized digitized data signal 213. Primary timing error signal 216 and absolute timing error signal 226 are combined by combiner circuitry 235, which, by nature of its operation, has the effect of performing the aforementioned high-pass filtering of primary timing error signal 216 thereby removing jitter, and low-pass filtering of absolute timing error signal 226 thereby removing adaptation errors. The combined timing error signal 236 is further integrated by a clock-data recovery loop filter, which may be implemented, for example in this implementation, by PID (Proportional-Integral-Derivative) circuitry 245. The integrated combined timing error signal 246 is input to phase-locked loop (PLL) circuit 255 which generates recovered clock signal 265.

Figure 3:
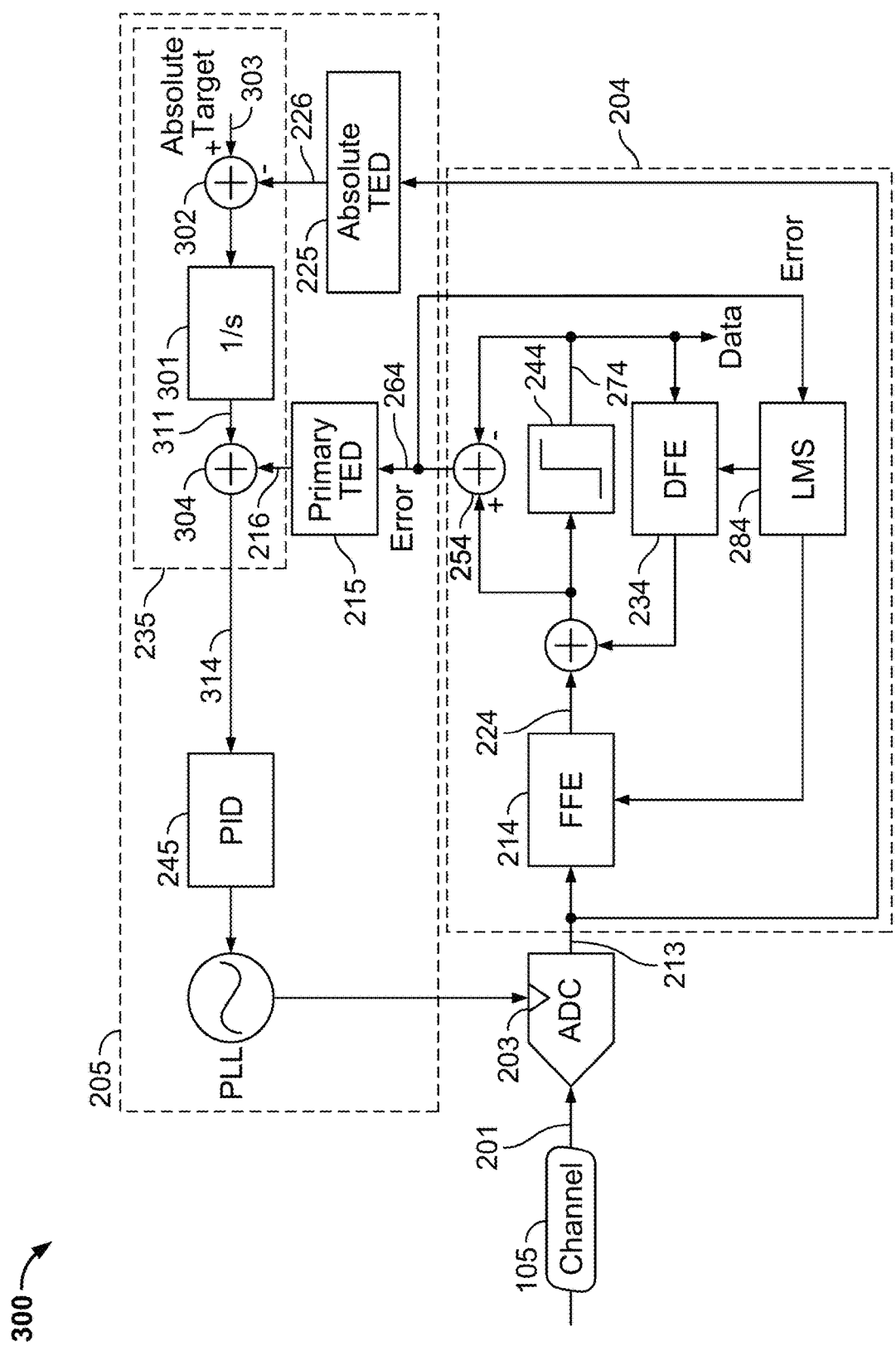
FIG. 3 is a schematic diagram of a first implementation of clock-data recovery circuitry in accordance with the subject matter of this disclosure.
Figure 4:
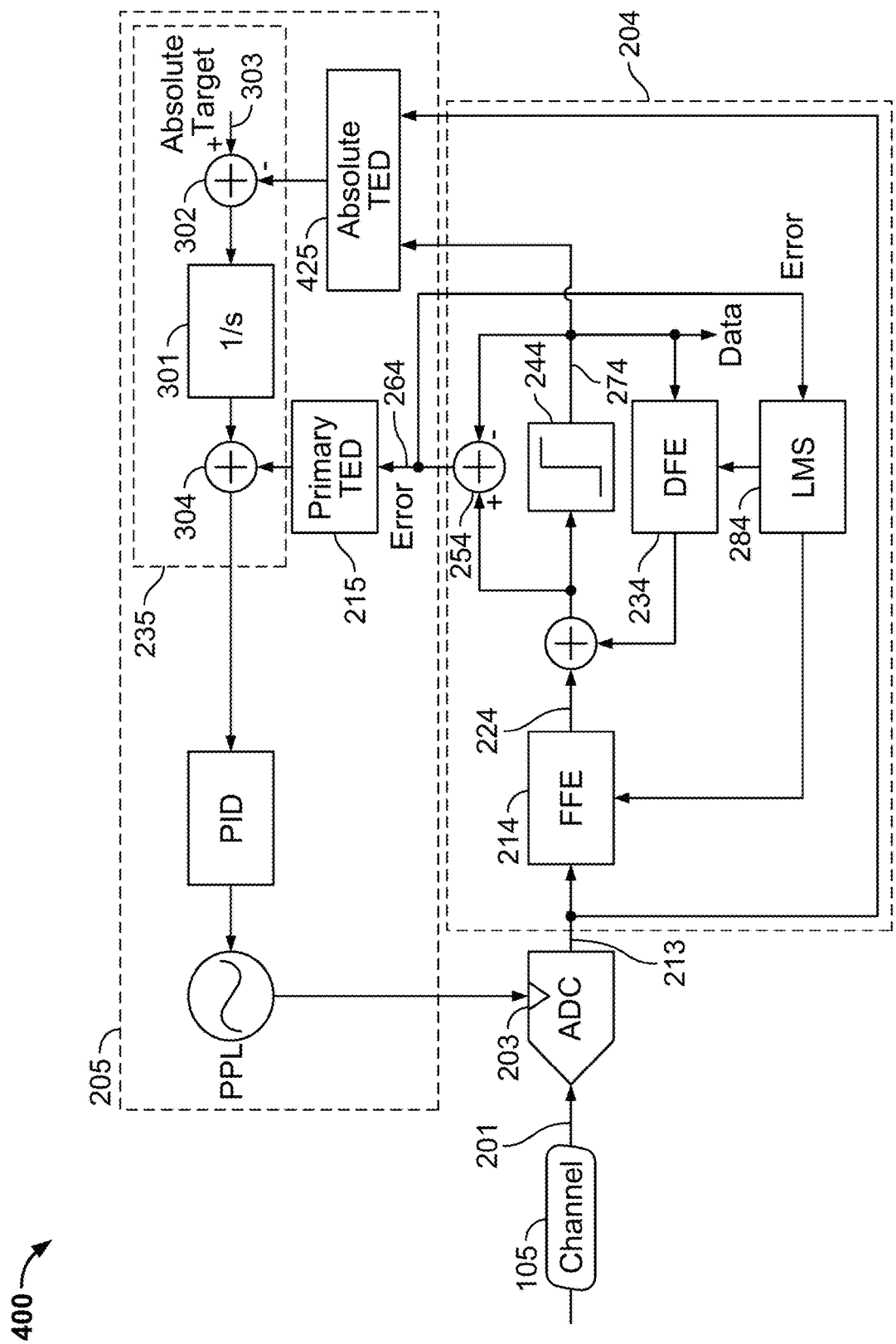
FIG. 4 is a schematic diagram of a second implementation of clock-data recovery circuitry in accordance with the subject matter of this disclosure.

In a first particular implementation 300 of clock-data recovery (CDR) circuitry in accordance with implementations of the subject matter of this disclosure, shown in FIG. 3, combiner circuitry 235 may include an integrator 301, an adder 302 for combining absolute timing error signal 226 with an adjustable sampling target 303, and an adder 304 for combining primary timing error signal 216 with integrated absolute timing error signal 311 to provide input timing signal 314 to PID circuitry 245. Because of integration at 301, absolute timing error signal 311 dominates the timing signal 314 at lower frequencies, accomplishing the high-pass and low-pass filtering described above. Adjustable sampling target 303 allows selection of the integrator sampling time, to minimize noise and improve the signal-to-noise ratio.

As noted above, the timing error detectors used in implementations of the subject matter disclosure may be known forms of timing error detectors such as a zero-forcing timing error detector, or a Mueller-Müller timing error detector. However, in further implementations of the subject matter of this disclosure, the absolute timing error detector, while deriving timing information from only the unequalized data signal, may nevertheless monitor the equalized data signal to remove components of inter-symbol interference (ISI) that may be present. Thus, in a second particular implementation 400 of clock-data recovery (CDR) circuitry in accordance with implementations of the subject matter of this disclosure, shown in FIG. 4, absolute timing error detector 225 may be replaced by modified absolute timing error detector 425, which has a second input coupled to recovered data signal 274, in addition to the input coupled to unequalized data signal 213.

A first implementation 500 of modified absolute timing error detector 425 is shown in FIG. 5. Modified absolute timing error detector 500 includes absolute timing error detector 225, with a front end 501 in which a two-clock-cycle-delayed version 574 of recovered data signal 274 is subtracted at 511 from the current recovered data signal 274, and the resulting signal 521 is combined at 531 with unequalized data signal 213, which has been delayed one clock cycle at 541 to match the delay of signal 521, for input to absolute timing error detector 225. This arrangement removes ISI components that are large enough to persist for two clock cycles.

A second implementation 600 of modified absolute timing error detector 425 is shown in FIG. 6. Modified absolute timing error detector 600 includes absolute timing error detector 225, with a front end 601. Front end 601 subtracts, at 511, two-clock-cycle-delayed version 574 of recovered data signal 274 from the current recovered data signal 274. Front end 601 also determines a cursor estimate by accumulating, at 611, and filtering, at 621, a one-clock-cycle-delayed version 674 of recovered data signal 274 and combines the filtered signal 602 at 603 with the one-clock-cycle-delayed signal 613, subtracting the combined cursor estimate signal 623 from the unequalized data signal 213. The difference signal 631 is combined at 531 with difference signal 521 for input to absolute timing error detector 225, and also for feeding back at 604 into accumulator 611.

Figure 7:
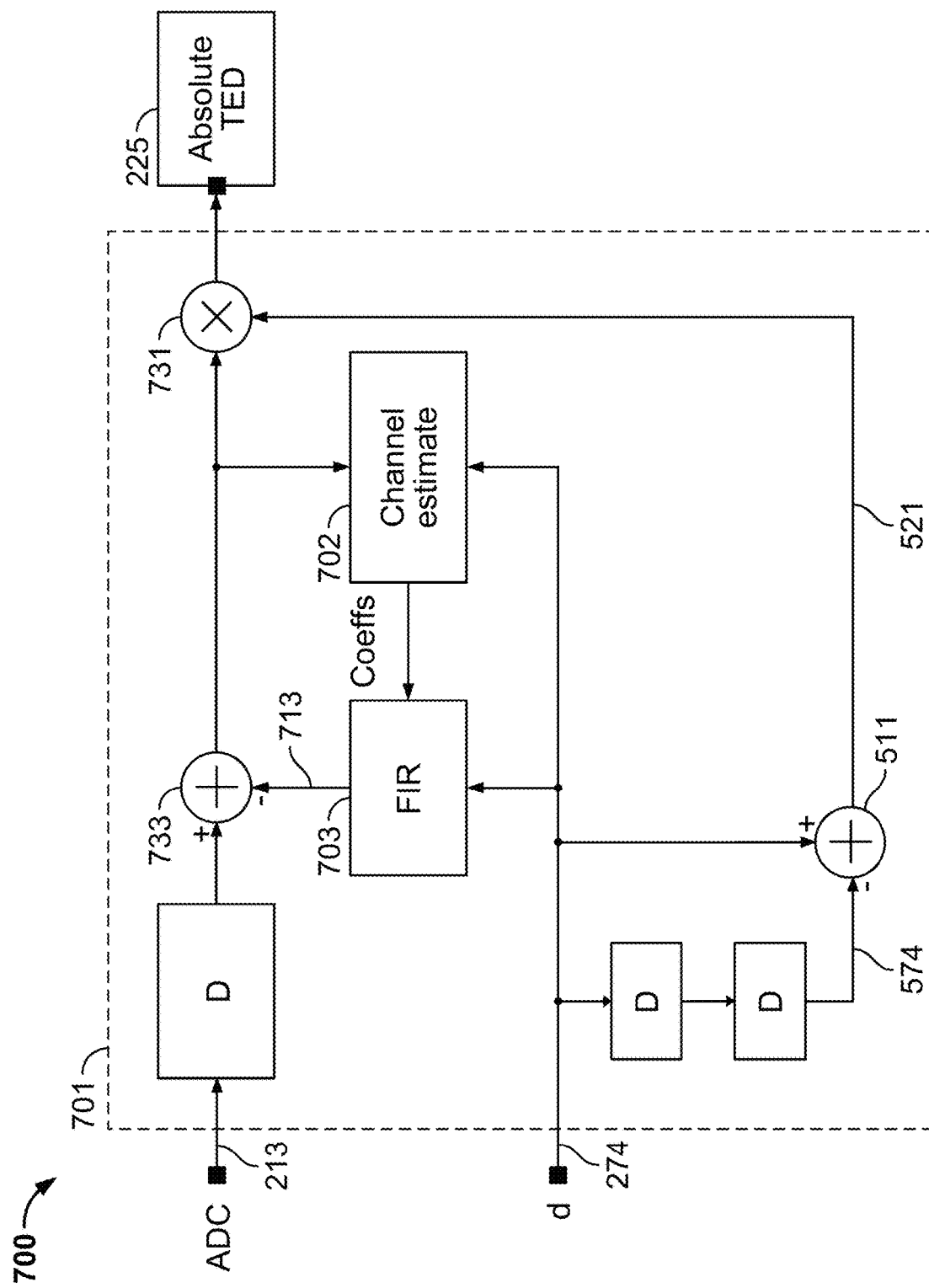
FIG. 7 is a schematic diagram of a third implementation of a modified timing error detector in accordance with the subject matter of this disclosure.

A third implementation 700 of modified absolute timing error detector 425 is shown in FIG. 7. Modified absolute timing error detector 700 includes absolute timing error detector 225, with a front end 701. Front end 701 subtracts, at 511, two-clock-cycle-delayed version 574 of recovered data signal 274 from the current recovered data signal 274, providing difference signal 521. Channel estimator circuitry 702 compares recovered data signal 274 to unequalized data signal 213 and generates coefficients for finite impulse response filter 703 that operates on recovered data signal 274. Filtered signal 713 is added at 733 to unequalized data signal 213, which is combined at 731 with difference signal 521 for input to absolute timing error detector 225.

Figure 8:
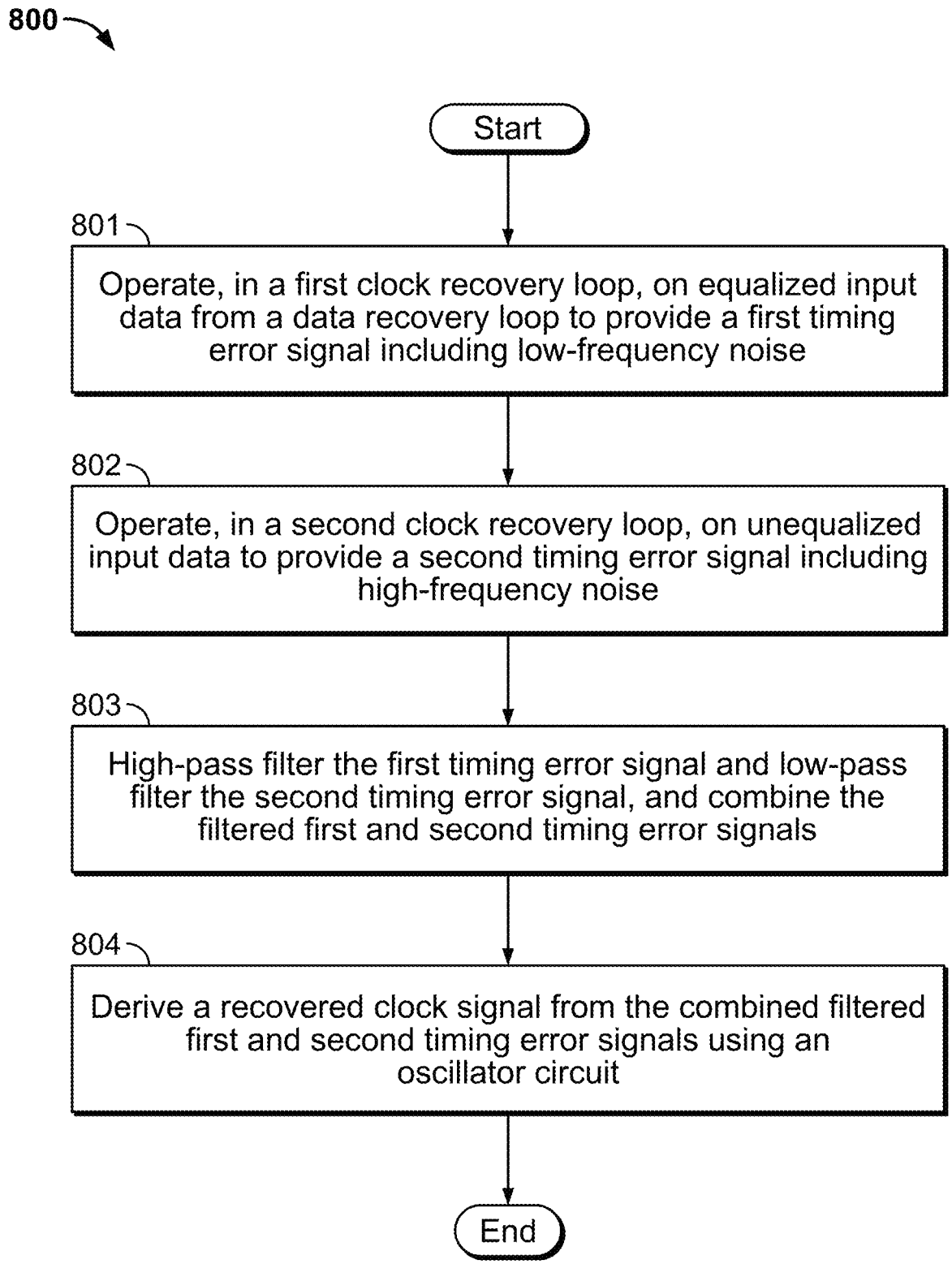
FIG. 8 is a flow diagram showing a method in accordance with implementations of the subject matter of this disclosure.

A visualization of a method 800 that is performed continually by operation of circuitry according to implementations of the subject matter of this disclosure for performing clock data recovery in an integrated circuit transceiver device is diagrammed in FIG. 8. Method 800 begins at 801 where equalized input data from a data recovery loop is operated on in a first clock recovery loop, to provide a first timing error signal including low-frequency noise. At 802, unequalized input data is operated on in a second clock recovery loop, to provide a second timing error signal including high-frequency noise. At 803, the first timing error signal is high-pass filtered, and the second timing error signal is low-pass filtered, and the filtered first and second timing error signals are combined. At 804, recovered clock signal is derived from the combined filtered first and second timing error signals using an oscillator circuit. As noted above, this method 800 may be performed continually and therefore may loop back to 801.

Thus it is seen that a dual clock recovery loop, and corresponding method, have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A data transceiver comprising:
   transmit circuitry;
   receive circuitry;
   a host interface configured to couple the transmit circuitry and the receive circuitry to a host device;
   a line interface configured to couple the transmit circuitry and the receive circuitry to a transmission medium, the line interface including a serializer configured to couple the transmit circuitry to the transmission medium and a deserializer configured to couple the transmission medium to the receive circuitry; wherein:
   the deserializer includes clock recovery circuitry configured to recover a clock from input data, the clock recovery circuitry comprising:
   a first clock recovery loop configured to operate on equalized input data from a data recovery loop to provide a first timing error signal;
   a second clock recovery loop configured to operate on unequalized input data to provide a second timing error signal;
   combining circuitry configured to combine the first and second timing error signals; and
   an oscillator circuit configured to derive a recovered clock signal from the combined first and second timing error signals.

2. The data transceiver of claim 1 wherein the oscillator circuit comprises a phase-locked loop configured to operate on the combined first and second timing error signals to derive the recovered clock signal.

3. The data transceiver of claim 1 wherein the combining circuitry comprises an integrator circuit configured to operate on the second timing error signal prior to adding the second timing error signal to the first timing error signal.

4. The data transceiver of claim 3 wherein the combining circuitry further comprises circuitry for adjusting sampling time of the integrator.

5. The data transceiver of claim 1 wherein:
   the first clock recovery loop includes a first timing error detector configured to provide the first timing error signal;
   the second clock recovery loop includes a second timing error detector configured to provide the second timing error signal; and
   the combining circuitry is configured to operate in a manner that filters the first timing error signal to remove low-frequency components including adaptation errors introduced by the data recovery loop, and that filters the second timing error signal to remove high frequency components including jitter.

6. The data transceiver of claim 5 wherein the second clock recovery loop comprises circuitry for removing inter-symbol interference from the unequalized input data prior to providing the second timing error signal.

7. The data transceiver of claim 6 wherein the circuitry for removing inter-symbol interference is configured to operate on recovered data from the data recovery loop.

8. The data transceiver of claim 7 wherein the circuitry for removing inter-symbol interference comprises:
   circuitry configured to subtract delayed recovered data from the recovered data; and
   circuitry configured to combine the recovered data, from which the delayed recovered data has been subtracted, with the unequalized input data prior to providing the second timing error signal.

9. The data transceiver of claim 8 wherein the circuitry for removing inter-symbol interference further comprises:
   circuitry configured to accumulate delayed recovered data;
   circuitry configured to combine the accumulated delayed recovered data with current delayed recovered data; and
   circuitry configured to subtract the combined accumulated delayed recovered data and current delayed recovered data from the unequalized input data prior to combining the unequalized input data with the recovered data, from which the delayed recovered data has been subtracted.

10. The data transceiver of claim 8 wherein the circuitry for removing inter-symbol interference further comprises:
    circuitry configured to filter the recovered data; and
    circuitry configured to subtract the filtered recovered data from the unequalized input data prior to combining the unequalized input data with the recovered data, from which the delayed recovered data has been subtracted.

11. The data transceiver of claim 10 wherein the circuitry configured to filter the recovered data comprises:
    channel estimator circuitry configured to derive a channel estimate from the recovered data and the unequalized input data, and to derive filter coefficients from the channel estimate; and
    finite impulse response filter circuitry to filter the recovered data based on the filter coefficients.

12. A method for recovering a clock from input data in a deserializer that couples a transmission medium to receive circuitry of a data transceiver, the method comprising:
   operating, in a first clock recovery loop, on equalized input data from a data recovery loop to provide a first timing error signal;
   operating, in a second clock recovery loop, on unequalized input data to provide a second timing error signal;
   combining the first and second timing error signals; and
   deriving a recovered clock signal from the combined first and second timing error signals using an oscillator circuit.

13. The clock recovery method of claim 12 wherein deriving the recovered clock signal from the combined filtered first and second timing error signals using the oscillator circuit comprises deriving the recovered clock signal from the combined filtered first and second timing error signals using a phase-locked loop configured to operate on the combined first and second timing error signals.

14. The clock recovery method of claim 12 wherein combining the filtered first and second timing error signals comprises integrating the second timing error signal prior to adding the second timing error signal to the first timing error signal.

15. The clock recovery method of claim 14 wherein combining the filtered first and second timing error signals further comprises adjusting sampling time of the integration.

16. The clock recovery method of claim 12 wherein combining the first and second timing error signals comprises operating on the first and second timing error signals in a manner that filters the first timing error signal to remove low-frequency components including adaptation errors introduced by the data recovery loop, and that filters the second timing error signal to remove high frequency components including jitter.

17. The clock recovery method of claim 16 further comprises removing, in the second clock recovery loop, inter-symbol interference from the unequalized input data prior to providing the second timing error signal.

18. The clock recovery method of claim 17 wherein removing the inter-symbol interference comprises operating on recovered data from the data recovery loop.

19. The clock recovery method of claim 18 wherein removing the inter-symbol interference comprises:
   subtracting delayed recovered data from the recovered data; and
   combining the recovered data, from which the delayed recovered data has been subtracted, with the unequalized input data prior to providing the second timing error signal.

20. The clock recovery method of claim 19 wherein removing the inter-symbol interference further comprises:
   accumulating delayed recovered data;
   combining the accumulated delayed recovered data with current delayed recovered data; and
   subtracting the combined accumulated delayed recovered data and current delayed recovered data from the unequalized input data prior to combining the unequalized input data with the recovered data, from which the delayed recovered data has been subtracted.

21. The clock recovery method of claim 19 wherein removing the inter-symbol interference further comprises:
   filtering the recovered data; and
   subtracting the filtered recovered data from the unequalized input data prior to combining the unequalized input data with the recovered data, from which the delayed recovered data has been subtracted.

22. The clock recovery method of claim 21 wherein filtering the recovered data comprises:
   deriving a channel estimate from the recovered data and the unequalized input data, and deriving filter coefficients from the channel estimate; and
   applying the filter coefficients to finite impulse response filter circuitry to filter the recovered data.

* * * * *